United States Patent
Hennig et al.

(10) Patent No.: US 9,117,997 B2
(45) Date of Patent: Aug. 25, 2015

(54) MULTILAYER PIEZOELECTRIC ACTUATOR

(75) Inventors: Eberhard Hennig, Mösdorf (DE); Peter Ditas, Münchenbernsdorf (DE); Daniel Kopsch, Grosstreben-Zwethau (DE)

(73) Assignee: PI CERAMIC GMBH KERAMISCHE TECHNOLOGIEN UND BAUELEMENTE, Lederhose (DE)

( * ) Notice: Subject to any disclaimer, the term of this patent is extended or adjusted under 35 U.S.C. 154(b) by 423 days.

(21) Appl. No.: 13/502,490

(22) PCT Filed: Oct. 12, 2010

(86) PCT No.: PCT/DE2010/001194
§ 371 (c)(1),
(2), (4) Date: Jun. 15, 2012

(87) PCT Pub. No.: WO2011/044882
PCT Pub. Date: Apr. 21, 2011

(65) Prior Publication Data
US 2012/0242196 A1    Sep. 27, 2012

(30) Foreign Application Priority Data
Oct. 17, 2009 (DE) .......................... 10 2009 049 718

(51) Int. Cl.
*H01L 41/083* (2006.01)
*H01L 41/047* (2006.01)
(52) U.S. Cl.
CPC .......... *H01L 41/083* (2013.01); *H01L 41/0475* (2013.01)
(58) Field of Classification Search
USPC ................................. 310/328, 364–366, 311
See application file for complete search history.

(56) References Cited

U.S. PATENT DOCUMENTS

| 7,449,077 | B2 | 11/2008 | Heinzmann et al. |
| 7,509,716 | B2 | 3/2009 | Omura et al. |

(Continued)

FOREIGN PATENT DOCUMENTS

| DE | 102 34 787 C1 | 10/2003 |
| DE | 10 2004 057 795 A1 | 6/2006 |

(Continued)

OTHER PUBLICATIONS

Office Action (Notice of Grounds of Rejection) issued by the Japanese Patent Office on Nov. 12, 2013, in the corresponding Japanese Patent Application No. 2012-533477 and an English translation of the Official Action. (7 pages).

(Continued)

*Primary Examiner* — Thomas Dougherty
*Assistant Examiner* — Karen B Addison
(74) *Attorney, Agent, or Firm* — Buchanan Ingersoll & Rooney PC

(57) ABSTRACT

An actuator body, including a plurality of piezoceramic layers, separated from each other by a positive or negative internal electrode in alternation, positive and negative collecting electrodes, which are arranged on two outer faces of the actuator body and are conductively connected to the associated positive or negative internal electrodes, wherein the actuator body of the multilayer actuator has at least one positive and one negative contacting electrode, by which the multilayer actuator is electrically contacted and is conductively connected to the associated positive or negative collecting electrode, and the contacting electrodes are arranged in areas of the actuator body that are provided with a base metallization. The areas of the actuator body with a base metallization are spaced apart from each other and distances from the internal electrodes, wherein the distances are not less than the thickness of the piezoceramic layers in the active area of the multilayer actuator.

21 Claims, 4 Drawing Sheets

(56) References Cited

U.S. PATENT DOCUMENTS

| | | |
|---|---|---|
| 7,745,981 B2 | 6/2010 | Omura et al. |
| 7,821,184 B2 | 10/2010 | Kaspar et al. |
| 2006/0055288 A1 | 3/2006 | Heinzmann et al. |
| 2007/0084034 A1 | 4/2007 | Omura et al. |
| 2007/0216264 A1* | 9/2007 | Furukawa et al. ............ 310/366 |
| 2009/0152999 A1 | 6/2009 | Omura et al. |
| 2009/0179527 A1 | 7/2009 | Kaspar et al. |
| 2010/0156251 A1* | 6/2010 | Hohmann et al. ............ 310/364 |
| 2010/0295420 A1 | 11/2010 | Wierach |
| 2011/0204754 A1* | 8/2011 | Kawada .................... 310/363 |
| 2013/0181581 A1* | 7/2013 | Ottlinger et al. .............. 310/363 |

FOREIGN PATENT DOCUMENTS

| | | |
|---|---|---|
| DE | 11 2005 001 022 T5 | 3/2007 |
| DE | 10 2006 040 316 A1 | 3/2008 |
| JP | 05-110157 A | 4/1993 |
| JP | 7-131084 A | 5/1995 |
| JP | 9-181368 A | 7/1997 |
| JP | 2003-023186 A | 1/2003 |
| JP | 200323186 A * | 1/2003 |
| JP | 2003-243740 A | 8/2003 |
| MD | 200323186 * | 1/2003 |

OTHER PUBLICATIONS

* International Search Report (PCT/ISA/210) issued on Apr. 7, 2011, by German Patent Office as the International Searching Authority for International Application No. PCT/DE2010/001194.

* cited by examiner (State of the art)

(State of the art)

(State of the art)

(State of the art)

(State of the art)

MULTILAYER PIEZOELECTRIC ACTUATOR

The invention relates to a multilayer piezoceramic actuator.

A multilayer actuator of the abovementioned type is known from DE 10 2006 040 316 A1. A piezoelectric surface actuator and a method for its manufacture are described there. The central piece is a conventional multilayer piezoelectric actuator whose outer contacting points (collecting electrodes) are provided with elastic contact surfaces that are known per se, whereby thin plates are then sawed from the body prepared in this way and these plates are then embedded in a polymer. The electrical contacting of the thin multilayer plate is brought about by means of printed conductors integrated into the polymer embedding. It is important thereby that a galvanic connection is achieved between the printed conductors and the elastic contact surfaces during the gluing process or the resin injection procedure. Such an arrangement and technology must already be considered to be critical purely in the context of stable mass production. Experiments have shown that reliable manufacture of such actuators is not possible with the proposed contacting.

A multilayer piezoelectric actuator is known from JP 2003-243740 A in which the electrical contacting of the collecting electrodes is guaranteed by means of decoupling electrodes, whereby the decoupling electrodes are located at a distance from the internal electrodes responsible for the deflection of the actuator and are themselves electrically connected to a connection line leading out of the actuator.

JP 07-131084 A describes a multilayer piezoelectric actuator in which the side collecting electrodes are supplied with electric voltage by means of two-dimensional electrodes arranged on the upper and lower faces of the actuator. For this purpose, pores filled with conductive material exist that are arranged between the collecting electrodes on the upper and lower faces and the internal electrodes that connect inside the actuator.

JP 09-181368 A discloses a multilayer piezoelectric actuator that is connected directly to a printed circuit board, whereby the electrical contacting of the collecting electrodes is realised by means of electrode layers arranged at the foot of the actuator. Connection electrodes are led to electrode layers arranged at the foot of the actuator by means of corresponding bore holes in the printed circuit board.

The object of the invention is therefore to ensure reliable contacting between the electrodes of the multilayer piezoelectric actuator and the outer contacting whereby a uniform withstand voltage is guaranteed throughout the entire actuator.

To solve this object, the invention provides a multilayer piezoceramic actuator with the features of claim 1.

The basic idea of the invention is to ensure the reliable contacting between the electrodes of the multilayer piezoelectric actuator and the outer contacting by means of significantly increasing the contact surfaces. According to the invention, this can be accomplished by already providing the actuator body with contacting electrodes when it is in the green state. Terminologically, distinctions are made between the terms "internal electrode", "contacting electrode" and "collecting electrode". In the framework of this invention, the term "internal electrode" indicates a positive or negative electrode that electrodes a piezoceramic layer in two dimensions in order to produce an (inverse) piezoelectric effect with which the electroded piezoceramic layer changes its shape under the influence of an electric field in order to allow actuator-type use of the piezoceramic, or in order to produce a direct piezoelectric effect with which charges are generated on the internal electrodes by means of the effect of a mechanical tension or stretching. In the framework of this invention, the term "collecting electrode" indicates an electrode by means of which the associated positive or negative internal electrodes are electrically supplied. In the framework of this invention, the term "contacting electrode" indicates an electrode by means of which the multilayer actuator is electrically contacted and by means of which the associated positive or negative collecting electrodes are electrically supplied. The contacting electrodes are preferably electrically insulated from one another. In the framework of this invention, the term "conductive" is understood to mean "electrically conductive".

In an advantageous further development of the invention, the positive and/or the negative contacting electrode reaches to at least an outer face, preferably to two outer faces, of the actuator body and preferably ends flush with the outer face or outer faces of the actuator body. The positive and/or the negative contacting electrode preferably lies free on at least one outer face of the actuator body and is accessible for electrical contacting. A plurality of piezoceramic layers are stacked one on top of the other to produce the multilayer piezoelectric actuator, whereby these layers are separated from each other by means of a positive or negative internal electrode in alternation in order to form a cuboid-shaped actuator body that can also be called a multilayer stack. The cuboid-shaped actuator body is then sawed, essentially perpendicularly to the extension plane of the piezoceramic layers, into a multiplicity of plate-shaped piezoceramic surface actuators. After the sawing process, the introduced contacting electrodes are preferably accessible from the main surfaces of the surface actuators for electrical contacting. The electrical contacting of the contacting electrodes preferably takes place by means of contacting collecting electrodes that are additionally put on to the outer faces of the actuator body and that lie between the outer faces of the actuator body provided with collecting electrodes.

It can be helpful if the positive and/or the negative contacting electrode directly contacts an inner face of the associated positive or negative collecting electrode. In this way, an optimal conductive connection between the positive and negative contacting electrodes and the associated positive or negative collecting electrodes can be ensured.

It can prove to be practical if the collecting electrodes are arranged on two outer faces of the actuator body that lie opposite of each other. In this way, the manufacture of piezoceramic surface actuators can be significantly simplified. The collecting electrodes are put on to two opposite outer faces of a multilayer stack that is then sawed so that the collecting electrodes remain conductively connected to the associated positive or negative contacting electrodes and to the associated positive or negative internal electrodes after the sawing process.

It can be advantageous if the actuator body of the multilayer piezoceramic actuator is formed with a cuboid or plate-like shape. Such geometric forms are suitable for the most common applications, particularly as a surface actuator.

In an advantageous further development of the invention, the actuator body has at least one passive area that lies outside the outermost two internal electrodes, whereby the positive and/or the negative contacting electrode is arranged within the passive area. The active area of the actuator body comprises the multiplicity of piezoceramic layers that are separated from each other by means of a positive or negative internal electrode in alternation, and is bordered by the two outermost internal electrodes. The passive area lies outside the two outermost internal electrodes, whereby this area is not primarily used for producing an (inverse) piezoceramic effect and the layers located in this area are not or are not primarily used in an actuator sense. While still in the green state, the actuator body is preferably already provided with passive end layers and the contacting electrodes are introduced into the passive end layers, whereby these contacting electrodes reach to the surface on the actual contact surfaces of the actuator and are electrically insulated from one another in the middle of the actuator.

It can be useful if the passive area has at least one piezoceramic layer. If identical materials with identical material properties are used in the active and passive areas, damages due to incompatible material pairings that, for example, are caused by expansion stresses, can be largely avoided.

It can also prove to be helpful if the actuator body has a plurality of passive areas in which at least one positive and/or at least one negative contacting electrode is arranged. In this way, larger contact surfaces can be provided for contacting the multilayer piezoceramic actuator. Preferably two passive areas are situated in a direction perpendicular to the extension direction of the piezoceramic layers, on opposite ends of the actuator body.

It can be advantageous if the geometric dimensions of the passive areas differ. This execution allows certain free spaces in the design of the multilayer actuator.

According to the invention, the contacting electrodes that are provided with a base metallization are arranged in areas of the actuator body. A plurality of positive and a plurality of negative contacting electrodes that are electrically insulated from one another are preferably each arranged in specific contiguous areas of the actuator body. These are preferably the passive areas of the actuator body in which no (inverse) piezoceramic effect is brought about. An area provided with a base metallization is preferably a sub-area of a passive area of the actuator body. The areas provided with a base metallization with different electrical polarity are electrically insulated from one another. The electroded surfaces and/or the narrow faces of the passive layers are preferably provided with a contiguous base metallization in the areas provided with a base metallization, so that the electrical conductivity is significantly improved there. For simplicity, these are called areas of the actuator body with a base metallization. A contact surface can be even further enlarged by means of contacting collecting electrodes.

It can be practical if the base metallization is applied by means of sputtering, evaporation, thick film technology or conductive adhesives. Metallization methods of these kinds can be achieved with relatively low costs.

According to the invention, the areas of the actuator body that are provided with a base metallization are spaced apart from one another at a distance that is not less than the thickness of the piezoceramic layers in the active area of the multilayer actuator. As a result, a uniform withstand voltage can be guaranteed throughout the entire multilayer actuator.

To avoid high internal mechanical stress, the distances between the areas of the actuator body that are provided with a base metallization are preferably selected in such a way that the electric field strengths between a positive and a negative contacting electrode do not exceed 0.5 times the coercive field strength of the piezoceramic material that is used.

It can be advantageous if the multilayer actuator is formed as a surface actuator and is embedded in plastic. A piezocomposite of that kind is robust and simple to handle and can be used in the widest range of applications.

Preferred further developments result from the dependent claims.

DETAILED DESCRIPTION OF THE PREFERRED EMBODIMENTS

Figure 1:
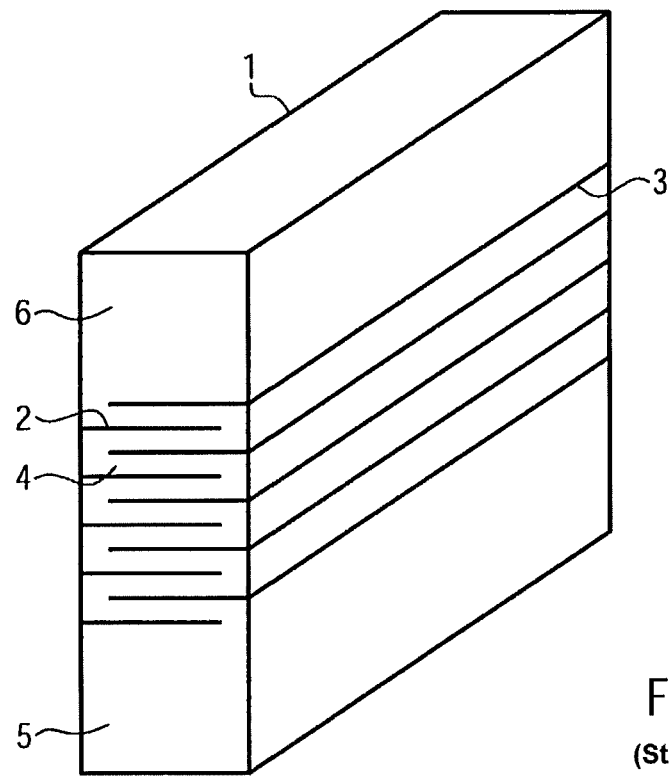
FIG. 1 shows a perspective view of a conventional actuator according to the state of the art.

The multilayer piezoceramic actuator 1 according to the invention comprises an actuator body with a multiplicity of piezoceramic layers 4 that are separated from one another by means of a positive or negative internal electrode 2, 3 in alternation, as well as positive and negative collecting electrodes 9, 10 that are arranged on two outer faces of the actuator body and that are conductively connected to the associated positive or negative internal electrodes 2, 3. The actuator body of the multilayer actuator 1 has at least one positive and one negative contacting electrode 7, 8 by means of which the multilayer actuator 1 is electrically contacted and which is conductively connected to the associated positive or negative collecting electrode 9, 10.

The actuator body is preferably already provided with passive end layers in the green state, and the contacting electrodes 7, 8 are introduced into these passive areas 5, 6, whereby these contacting electrodes 7, 8 reach to the surface on the actual contact surfaces of the actuator 1 and are electrically insulated from one another in the middle of the actuator 1. After the sawing process, the contacting electrodes 7, 8 that have been introduced in this way are accessible from the main surfaces of the actuator plate for electrical contacting, whereby this can take place by means of additionally applied structured collecting electrodes.

FIG. 1 shows a perspective view of a conventional actuator 1 with internal electrodes 2 and 3, the piezoceramic layers 4 that lie between the internal electrodes 2 and 3 and the passive areas 5 and 6 with passive ceramic layers.

Figure 2:
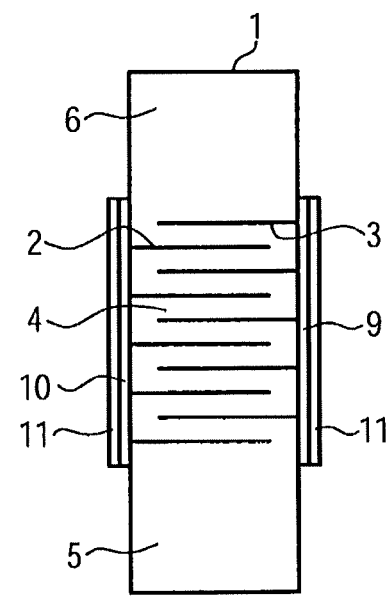
FIG. 2 shows the actuator according to FIG. 1 in cross-section.

FIG. 2 shows an actuator 1 according to FIG. 1 in cross-section. Additionally shown here are the collecting electrodes 9 and 10 applied on the contact surfaces of the actuator 1 and the contact surfaces 11 applied on these that can also extend across the entire length of the actuator 1.

Figure 3:
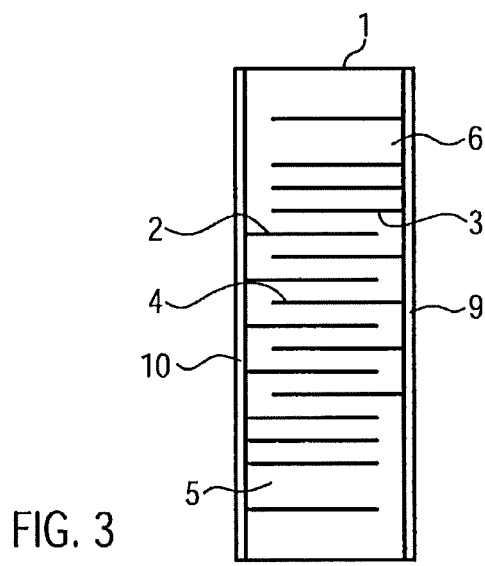
FIG. 3 shows a cross-section of a further actuator according to the state of the art.

FIG. 3 shows a cross-section of an actuator 1 according to the teachings of the publication DE 11 2005 001 022 T5.

Figure 4:
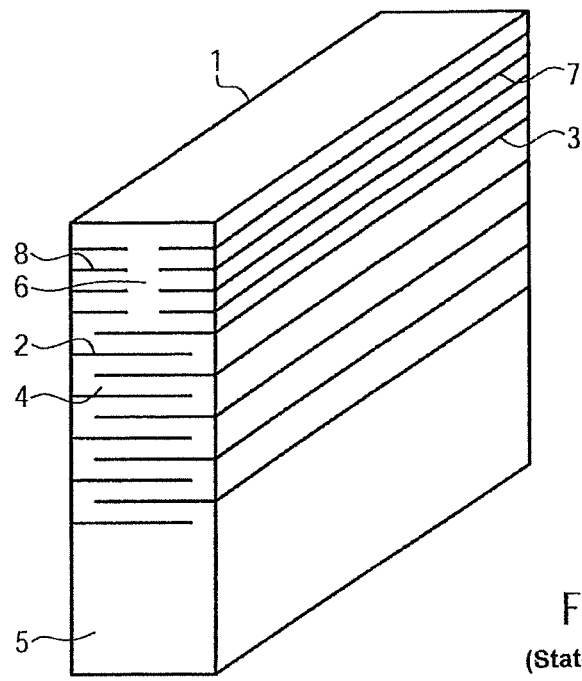
FIG. 4 shows a perspective view of an actuator according to the state of the art for the purpose of explanation.

FIG. 4 shows a perspective view for explaining an actuator 1 similar to the teachings of JP2003-243740A (not an embodiment of the invention) with internal electrodes 2 and 3, the active piezoceramic layers 4 in the active area of the actuator 1 and the passive piezoceramic layers in the passive areas 5 and 6 with the contacting electrodes 7 and 8 according to the invention introduced. The contacting electrodes 7 and 8 can be introduced in either one or both passive areas 5 and 6. It is also possible that the geometric dimensions of the passive ceramic layers in the passive areas 5 and 6 are formed such that they differ significantly. Each of the passive areas 5 and 6 preferably comprises piezoceramic layers in the same manner in which they are also used in the active area of the actuator body. Unlike in the active area, the ceramic layers of the passive areas 5 and 6 are not separated by a positive or negative internal electrode 2 and 3 in alternation; instead they are separated by both a positive and a negative contacting electrode 7 and 8 that project into the actuator body from the outer face provided with the collecting electrodes 9 and 10 in each case by approximately 20 to 40%, preferably 25 to 35%, more preferably 30% of the distance between the collecting electrodes 9 and 10 and that are electrically insulated from one another in the middle.

Figure 5:
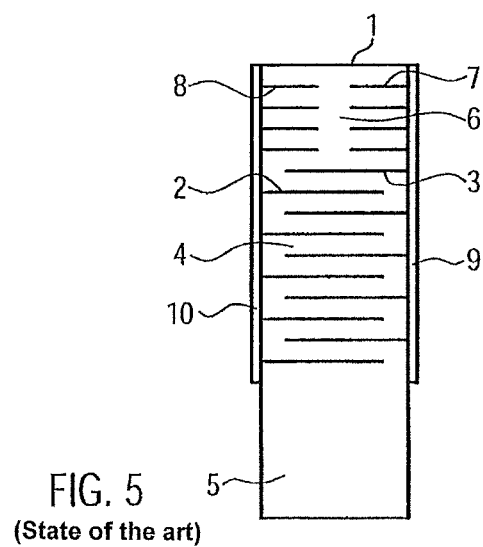
FIG. 5 shows a cross-section of an actuator according to FIG. 4.

FIG. 5 shows a cross-section of an actuator 1 according to FIG. 4 with contacting electrodes 7, 8 introduced in the passive areas 5, 6. The contacting electrodes 7 in the passive area 5 are thereby conductively connected to the internal electrodes 3 of the active area by means of the collecting electrode 9, and the contacting electrodes 8 of the passive area 5 are conductively connected to the internal electrodes 2 of the active area by means of the collecting electrode 10.

Figure 6:
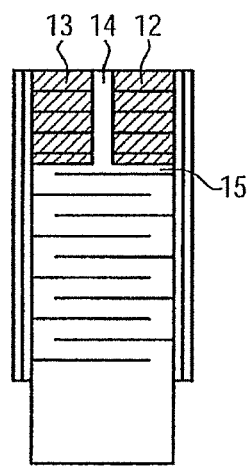
FIG. 6 shows a cross-section of an actuator according to the invention according to the first embodiment, whereby the contacting electrodes are arranged in a passive end layer of the actuator body in areas that are provided with a base metallization.
Figure 7:
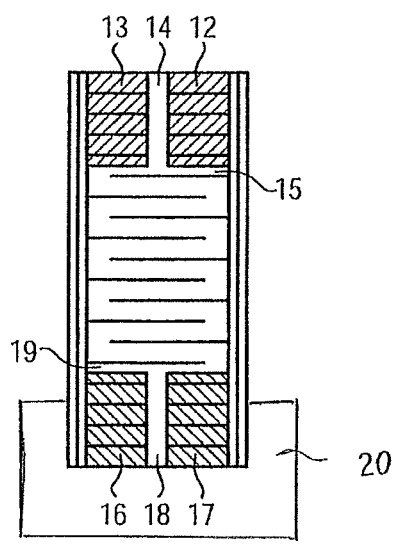
FIG. 7 shows a cross-section of an actuator according to the invention according to the second embodiment, whereby the contacting electrodes are arranged in different passive end layers of the actuator body in areas that are provided with a base metallization.

FIG. 6 and FIG. 7 show cross-sections of the actuators according to the first or second embodiment of the invention, respectively, with contacting electrodes in the passive areas as in FIGS. 4 and 5. For better outer contacting of the actuator, the areas of the contacting electrodes are provided with further base metallizations 12, 13, 16, 17 that are spaced apart from one another by the distances 14 and 18 and from the internal electrodes by the distances 15 and 19. Taking further configuration criteria into consideration, the base metallizations can be applied by means of all known metallization methods, such as, for example, sputtering, evaporation, thick-film technology, conductive adhesives, etc. In order to guarantee a uniform withstand voltage throughout the entire actuator, the distances 14, 15, 18 and 19 should be selected such that they are not less than the thickness of the active ceramic layers. To avoid high inner mechanical stress, they are advantageously selected in such a way that the electric field strengths between electrodes with different electric potential do not exceed 0.5 times the coercive field strength of the piezoceramic material that is used. In a non-limiting embodiment, the actuator 1 is formed as a surface actuator and is embedded in plastic 20.

In the case of the actuators according to the invention, it can prove to be advantageous to arrange the areas with the contacting electrodes in the middle instead of at the ends of the actuator. The approach to the solution is also not restricted to cuboid-shaped multilayer actuators, and it is rather the case that it can be realised in all common designs. In principle, it is also possible to manufacture the active areas with the internal electrodes and the passive areas with the contacting electrodes separately and to connect them in the sintered state by means of common construction and connection methods, such as gluing, for example.

Reliable contacting of multilayer piezoceramic actuators, particularly of thin multilayer plates in surface actuators, is given with the present invention. In addition to the contacting of multilayer actuators for patch transducers, this manner of contacting can be used for contacting all conventional multilayer actuators. In particular the installation of actuators into complex mechanical systems can be simplified due to the fact that the outer contacting of the actuators can take place on an outer surface.

The invention claimed is:

1. A multilayer piezoceramic actuator comprising:
   an actuator body with a plurality of piezoceramic layers which are separated from each other by means of a positive or negative internal electrode in alternation; and
   positive and negative collecting electrodes which are arranged on two outer faces of the actuator body and are conductively connected to the associated positive or negative internal electrodes,
   wherein the actuator body of the multilayer actuator has at least one positive and one negative contacting electrode, by means of each of which the multilayer actuator is electrically contacted and each of which is conductively connected to the associated positive or negative collecting electrode, and the contacting electrodes are arranged in areas of the actuator body that are provided with a base metallization, the base metallization is continuously provided in a stack of the piezoceramic layers that are in the areas of the actuator body, and the piezoceramic layers are separated by at least one positive and negative contacting electrode,
   wherein the areas of the actuator body that are provided with a base metallization are spaced apart from each other by distances and from the internal electrodes by distances, and
   wherein the distances are not less than the thickness of the piezoceramic layers in the active area of the multilayer actuator.

2. A multilayer piezoceramic actuator according to claim 1, wherein the positive and/or the negative contacting electrode reaches to at least one outer face of the actuator body.

3. A multilayer piezoceramic actuator according to claim 2, wherein the collecting electrodes are arranged on two opposite outer faces of the actuator body.

4. A multilayer piezoceramic actuator according to claim 2, wherein the actuator body of the multilayer piezoceramic actuator is formed with a cuboid or plate-like shape.

5. A multilayer piezoceramic actuator according to claim 2, wherein the actuator body has at least one passive area that lies outside the two outermost internal electrodes, wherein the positive and/or the negative contacting electrode is arranged within the passive area.

6. A multilayer piezoceramic actuator according to claim 2, wherein the positive and/or the negative contacting electrode reaches to two outer faces of the actuator body, and ends flush with at least one outer face of the actuator body.

7. A multilayer piezoceramic actuator according to claim 1, wherein the positive and/or the negative contacting electrode directly contacts an inner face of the associated positive or negative collecting electrode.

8. A multilayer piezoceramic actuator according to claim 7, wherein the collecting electrodes are arranged on two opposite outer faces of the actuator body.

9. A multilayer piezoceramic actuator according to claim 7, wherein the actuator body of the multilayer piezoceramic actuator is formed with a cuboid or plate-like shape.

10. A multilayer piezoceramic actuator according to claim 7, wherein the actuator body has at least one passive area that lies outside the two outermost internal electrodes, wherein the positive and/or the negative contacting electrode is arranged within the passive area.

11. A multilayer piezoceramic actuator according to claim 1, wherein the collecting electrodes are arranged on two opposite outer faces of the actuator body.

12. A multilayer piezoceramic actuator according to claim 11, wherein the actuator body of the multilayer piezoceramic actuator is formed with a cuboid or plate-like shape.

13. A multilayer piezoceramic actuator according to claim 1, wherein the actuator body of the multilayer piezoceramic actuator is formed with a cuboid or plate-like shape.

14. A multilayer piezoceramic actuator according to claim 1, wherein the actuator body has at least one passive area that lies outside the two outermost internal electrodes, wherein the positive and/or the negative contacting electrode is arranged within the passive area.

15. A multilayer piezoceramic actuator according to claim 1, wherein the passive area has at least one piezoceramic layer.

16. A multilayer piezoceramic actuator according to claim 1, wherein the actuator body has a plurality of passive areas in which at least one positive and/or at least one negative contacting electrode is arranged.

17. A multilayer piezoceramic actuator according to claim 16, wherein the geometric dimensions of the passive areas differ.

18. A multilayer piezoceramic actuator according to claim 1, wherein the distances are selected in such a way that the electric field strengths between a positive and a negative contacting electrode do not exceed 0.5 times the coercive field strength of the piezoceramic material that is used.

19. A multilayer piezoceramic actuator according to claim 1, wherein the multilayer actuator is formed as a surface actuator and is embedded in plastic.

20. A multilayer piezoceramic actuator according to claim 1, wherein the actuator body has at least one passive area, and the at least one passive area has two areas provided with the base metallization, and the two areas are spaced apart.

21. A multilayer piezoceramic actuator according to claim 2, wherein the positive and/or the negative contacting electrode directly contacts an inner face of the associated positive or negative collecting electrode.

* * * * *